United States Patent [19]

Imazeki

[11] 4,291,412

[45] Sep. 22, 1981

[54] PORTABLE RADIO FREQUENCY/CHANNEL DISPLAY SYSTEM

[75] Inventor: Kazuyoshi Imazeki, Tokyo, Japan

[73] Assignee: General Research of Electronics, Inc., Tokyo, Japan

[21] Appl. No.: 162,761

[22] Filed: Jun. 25, 1980

[51] Int. Cl.³ .............................................. H04B 1/16
[52] U.S. Cl. .................................... 455/154; 340/805; 340/811
[58] Field of Search ............................... 455/154–159; 358/192.1; 340/785, 789, 811, 784, 805

[56] References Cited

U.S. PATENT DOCUMENTS

| | | | |
|---|---|---|---|
| 3,720,876 | 3/1973 | Montgomery | 455/154 |
| 3,812,489 | 5/1974 | Hirano et al. | 340/811 |
| 3,938,131 | 2/1976 | Van Doorn et al. | 340/785 |
| 3,938,138 | 2/1976 | Kojima et al. | 340/811 |
| 3,955,185 | 5/1976 | Nishimura | 340/805 |
| 4,074,256 | 2/1978 | Sekiya et al. | 340/785 |

Primary Examiner—Marc E. Bookbinder
Attorney, Agent, or Firm—Trexler, Wolters, Bushnell & Fosse, Ltd.

[57] ABSTRACT

A portable radio frequency/channel display control system for use in a portable radio device or the like which is powered by a battery and of the type which includes a display for indicating the frequency/channel to which the radio is tuned. The system senses when a radio control is operated (such as the on/off switch, channel selector, etc.) and develops a control signal having a predetermined duration. The control signal causes the display to be energized for the predetermined duration and then the display is automatically de-energized.

5 Claims, 1 Drawing Figure

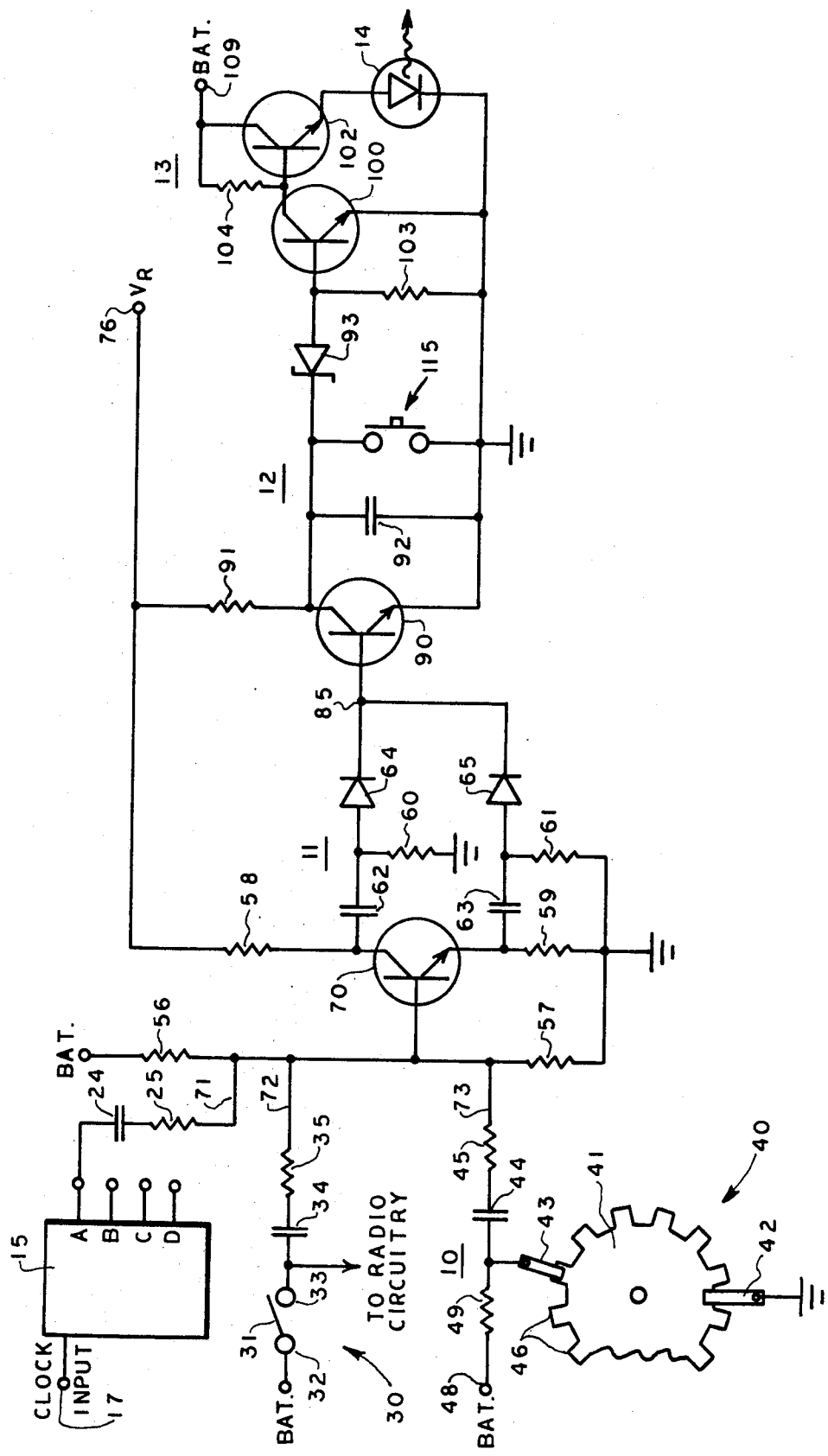

PORTABLE RADIO FREQUENCY/CHANNEL DISPLAY SYSTEM

BACKGROUND OF THE INVENTION

The present invention is generally directed to a display control system and more particularly to a display control system for use in battery-powered portable radio equipment or the like.

With the ever-increasing substitution of solid-state components for tubes in electronic equipment, electronic equipment of virtually all forms has become adapted for portable use. Because solid-state components do not require the relatively high voltages for operation as required by their tube counterparts and because the power consumption of solid-state devices is generally much lower than that required by vacuum tubes, solid-state electronic equipment is readily adapted for portable operation. In practice, it has been found that solid-state electronic equipment, such as transistor radios, may be operated for many hours when powered by self-contained depletable power sources such as batteries.

In many instances, it is necessary or desirable to provide an indication of various electronic equipment functions. For example, in a receiving device adapted to receive and/or transmit radio signals carried over a plurality of frequencies/channels, it is usually necessary or desirable to know the frequency or channel to which the receiver is tuned. Such an indicating means would be used in, for example, multiple-channel citizens band ("CB") receivers, public service ("PS") receivers, or the like. Quite often it is desirable to provide an illuminated frequency or channel display to enhance visibility, especially in the dark. The illumination may take the form of a seven-segment digital display, a plurality of lamps physically located adjacent channel-selector positions, an incandescent lamp to illuminate non-luminous channel indications, light-emitting diodes ("LED's"), segmented and dot-matrix light emitting diode displays, gas discharge tubes, fluorescent tubes or any other suitable form.

Unfortunately, however, such illumination generally presents a significant drain on the battery or other source. Practice has shown that illuminated displays often represent a greater load on the battery than the electronic circuitry of the device. As a result, when such indicators are employed in portable equipment and continuously energized, the portable equipment operating time is substantially reduced requiring frequent battery replacement or recharging.

It is therefore a general object of the present invention to provide a new and improved display control system for conserving power in portable radio equipment.

It is another object of the present invention to provide a display control system for use in a portable radio transceiver.

It is a still further object of the present invention to provide such a display control system for conserving the power of a portable radio device which is relatively simple and economical to construct and which does not interfere with the operating ease of the radio.

SUMMARY OF THE INVENTION

In a portable radio device of the type which is powered by a battery or other depletable power source, and which includes a plurality of controls for operating a corresponding plurality of radio functions and a display for indicating the frequency or channel to which the radio is tuned, a display control system is provided which comprises sensing means coupled to the controls for generating an initiation signal in response to the operation of any of the functions by the controls. Detecting means are coupled to a sensing means and are responsive to the initiation signal for developing a control signal in response to the generation of the initiation signal. Signal lengthening means are coupled to the detector means and are responsive to the control signal for effectively lengthening the duration of the control signal for a predetermined amount of time. Switch means are coupled between the display and the battery and are responsive to the lengthened control signal for causing the display to be energized by the battery for the predetermined amount of time, whereby the display is energized whenever a control is operated and is automatically de-energized after the passage of a predetermined amount of time to thus conserve the battery.

BRIEF DESCRIPTION OF THE DRAWING

The features of the present invention which are believed to be novel are set forth with particularity in the appended claims. The organization and manner of operation of the invention, together with further objects and advantages thereof, may best be understood with reference to the following description taken in conjunction with the accompanying drawing, in which the single figure is a schematic circuit diagram of a portable radio frequency/channel display control system embodying the present invention.

DESCRIPTION OF THE PREFERRED EMBODIMENT

Referring now to the figure, it illustrates in schematic diagram form a portable radio frequency/channel display control system adapted for use in a portable radio of the type which is powered by a battery or the like. Such radios commonly include, for example, portable broadcast receivers, portable citizens band (CB) transceivers and portable public service (PS) receivers (scanning or manually-tuned). It is, of course, understood that many other types of radios could also utilize this invention. The display control system illustrated generally includes sensing means 10, detecting means 11, signal lengthening means 12, and a display indicator enabling means 13. Also illustrated is a representative display taking the form of a light emitting diode (LED) 14, the energization of which is controlled by the display control system of the invention. LED 14 could be used, for example, to indicate that the radio is tuned to a given channel or frequency by mounting LED 14 adjacent to the indicia-carrying portion of a rotary dial. Of course, the LED display 14 is representative of but one of the many different varieties of illuminating displays or indicators which may be employed with the display control system of the present invention. It is understood that the display may take the form of segmented or dot-matrix digital or alphanumeric indicators using LED's, gas-discharge tubes, fluorescent tubes, incandescent lamps, or the like witout departing from the principles of this invention.

The illustrated embodiment of the invention includes three types of controls, 15, 30 and 40, for operating a corresponding plurality of radio functions. Another control, display switch 115, is provided to enable actuation of the display without disturbing any of the other controls. These three controls are representative of some of the various different controls that may be employed within a portable radio device, which utilizes the present invention.

One of the illustrated controls comprises a sequencing means 15 which includes or is driven by a conventional clock (not shown) to produce an output signal sequentially on terminals A, B, C and D. The sequencing means may be embodied in an integrated circuit typically referred to as a one-of-four decoder. The circuit 15 provides sequential addressing signals at outputs A through D for sequentially addressing a plurality of radio tuning circuits (not shown) and the corresponding display indicators (only one is shown) one at a time. Such a circuit is particularly adapted for use in a scanning type multi-frequency receiver wherein a plurality of predetermined frequencies are sequentially scanned and wherein the scanning sequence is interrupted upon the reception of one of these frequencies. For illustrative purposes, only output A is shown coupled to the sensing means 10, which in this instance comprises a source of voltage "B" (which may be the unregulated battery voltage), a capacitor 24 and resistor 25 which are connected between output terminal A and supply voltage B and the input of detecting means 11 at the base of transistor 70. Capacitor 24 and resistor 25 form a differentiating or pulse-generating circuit together with transistor biasing resistors 56 and 57.

In practice, each of the plurality of display indicators corresponds to a respective one of the frequencies which may be received by the portable receiving device. Each time a new display indicator is addressed by the circuit 15, indicating that a new channel frequency has been addressed, an initiation signal will be generated on line 71 and applied to detecting means 11 at the base of transistor 70. In the illustrated embodiment of the invention, a pulse is generated on line 71 whenever output terminal A is addressed (i.e., has an output signal thereon).

A second embodiment of the sensing means responds to the operation of an on-off switch means 30 which energizes and de-energizes the portable radio device in a conventional manner. The on-off switch means 30 includes a switch 31 having first and second terminals 32,33 connected between the conventional circuitry (not shown) of the radio and the battery power source "BAT". Second terminal 33 also is coupled to the detecting means 11 by a coupling capacitor 34 and resistor 35, which in cooperation with the battery form a pulse-generating circuit. When switch 31 is closed, the battery is connected to the radio circuitry for energizing the receiver, and a pulse is generated on line 72 which is applied to detecting means 11 at the base of transistor 70.

A third embodiment of the sensing means comprises a pulse-generating circuit, including resistor 49, capacitor 44, and resistor 45, which responds to a rotary frequency/channel selector 40 having a multi-position wafer switch 41 with a wiper arm 42 coupled to ground and a switch arm 43 arranged to engage each of a plurality of switch contacts 46 which are carried by a wafer 47 as the wafer 47 is rotated through a plurality of respective switch positions. As the frequency/channel selector 40 is rotated, arm 43 selectively contacts one of the plurality of contacts 46 and the pulse-generating circuit generates an initiating signal in the form of a pulse on line 73 which is applied to the input of detecting means 11 at the base of transistor 70. Such a pulse is generated each time arm 43 engages a contact 46 because, upon such engagement, the junction of resistor 49 and capacitor 44 is grounded via arm 43, wafer 41 and grounding arm 42 to thus generate a pulse the polarity of which is negative when the battery supply voltage "BAT" is positive and vice-versa.

It is understood that this system may be altered to utilize only selected control(s) to operate the system of the invention, or may be utilized in cooperation with other controls not shown in the illustrated embodiment of the invention, without departing from the principles of the invention.

The initiating signals generated by the sensing means 10 are coupled to the detecting means 11 wherein a corresponding control signal is developed. The detecting means comprises an amplifier circuit including an NPN transistor 70 having the conventional emitter, base and collector electrodes. The circuit has an output terminal 85 and a first diode 65 coupled between the emitter of transistor 70 and terminal 85, and a second diode 64 coupled between the collector of transistor 70. Diodes 64,65 are coupled to the collector and emitter of transistor 70 by capacitors 62,63, respectively.

A resistor 58 couples the collector to a terminal 76 which is provided with a regulated voltage $V_R$ derived from the battery. Since the particular means for regulating the battery voltage is not very important to the understanding of the invention, it is not shown in the drawing. A regulated voltage for transistor 70 (and transistor 90 described hereinafter) is sometimes desirable to more closely control the switching voltages and times, especially in situations where the magnitude of the battery voltage fluctuates significantly with time and/or operating conditions.

A positive pulse applied to the base of amplifier transistor 70 appears as an amplified negative pulse at the collector of transistor 70, but it appears as a positive pulse at the emitter of transistor 70. Diode 64 blocks the negative collector pulse from output terminal 85 whereas diode 65 passes the positive emitter pulse to terminal 85. For a negative pulse applied to the base of transistor 70, the reverse takes place; that is, a positive pulse is developed at the collector and a negative pulse at the emitter. The positive collector pulse is passed by diode 64 but the negative emitter pulse is blocked. Thus a positive pulse control signal is developed at the output terminal 85 of the detecting means 11 when either a positive or a negative pulse initiating signal is applied to the input of detecting means 11.

The delay or signal lengthening means 12 comprises a switching transistor 90 having an RC timing network, including resistor 91 and capacitor 92, coupled to its collector as shown in the drawing. Transistor 90 normally is biased or turned off so that its collector voltage is high (i.e., the voltage of $V_R$). This collector voltage is coupled to the switch means 13 by a Zener diode 93. When a control signal in the form of a positive pulse, in the illustrated embodiment of the invention, is applied to the input of signal lengthening means 12 (i.e., the base of transistor 90), transistor 90 is turned on which drops its collector voltage to almost zero. The voltage at the base of a switching transistor 100 of switch means 13 thus is also almost zero by virtue of Zener diode 93 and turned-on transistor 90.

When the relatively short input pulse control signal is no longer present at the base of transistor 90, transistor 90 returns to the off state and its collector voltage begins to increase at a rate determined by the time constant of resistor 91 and capacitor 92. Because of the reverse breakdown or "Zener" voltage of Zener diode 93, the increase in collector voltage is not passed or coupled to the base of switching transistor 100 until the collector voltage rises above the Zener voltage, thus effectively delaying or lengthening the duration of the control signal.

A momentary-contact display switch 115 is provided in parallel with transistor 90 to enable generation of the lengthened control signal, which thus enables actuation of the display as hereinafter described, manually without having to disturb any of the other radio controls. Actuating switch 115 momentarily has the same effect as turning on transistor 90; that is, the collector voltage is reduced to zero and it then gradually rises to the level of voltage $V_R$. When it surpasses the Zener voltage, it is then applied to the base of transistor 100.

Switch means 13 comprises a pair of switching transistors 100,102 which are biased such that when switching transistor 100 is turned on, switching transistor 102 is turned off, and vice versa. Turning on switching transistor 102 energizes the display which in this embodiment is an LED 14. As long as the collector voltage of transistor 90 is high, switching transistor 100 is turned on and the display is de-energized. When transistor 90 is turned on by a control signal, or when switch 115 is closed, switching transistor 100 is turned off and switching transistor 102 is turned on, thus energizing LED display 14 for a predetermined amount of time.

From the foregoing, it can be seen that the present invention provides a new and improved channel/frequency display indicator control system for use in portable, battery-powered electronic equipment such as a radio. The display control system of the present invention not only automatically limits the energization time of the display indicator to a predetermined display time interval to thus conserve the depletable battery power source of the portable equipment, but additionally, does not detract from the ease of operation of such portable equipment.

While a particular embodiment of the invention has been shown and described in detail, it will be obvious to those skilled in the art that changes and modifications of the present invention, in its various aspects, may be made without departing from the invention in its broader aspects, some of which changes and modifications being matters of routine engineering or design and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. In a portable radio device of the type which is powered by a battery or other depletable power source, and which includes a plurality of controls for operating a corresponding plurality of radio functions and a display for indicating the frequency or channel to which the radio is tuned, a display control system comprising: sensing means coupled to said controls for generating an initiation signal in response to the operation of any of said functions by said controls; detecting means coupled to said sensing means and responsive to said initiation signal for developing a control signal in response to the generation of said initiation signal; signal lengthening means coupled to said detector means and responsive to said control signal for effectively lengthening the duration of said control signal for a predetermined amount of time; and switch means coupled between said display and said battery and responsive to said lengthened control signal for causing said display to be energized by said battery for said predetermined amount of time, whereby the display is energized whenever a control is operated and is automatically de-energized after the passage of a predetermined amount of time to thus conserve the battery.

2. A display control system as defined in claim 1 wherein said sensing means comprises a plurality of pulse generating circuits respectively coupled to said plurality of radio controls for generating corresponding pulse signals in response to the operation of the associated functions by the respective control.

3. A display control system as defined in claim 2 wherein each pulse generating circuit associated with its respective control comprises the series combination of a capacitor and a resistor coupled between said respective control and said detecting means.

4. A display control system as defined in claim 2 wherein some of said pulse generating means produce positive polarity pulses and others of said pulse generating means produce negative polarity pulses, and wherein said detecting means includes means for sensing both positive and negative pulse initiation signals.

5. A display control system as defined in claim 4 wherein said detecting means comprises an amplifier circuit including a transistor having an emitter, base and collector, said amplifier circuit having an output terminal and a first diode coupled between said emitter and said output terminal and having a second diode coupled between said collector and said output terminal.

* * * * *